(12) United States Patent
Sintorn et al.

(10) Patent No.: US 9,711,323 B2
(45) Date of Patent: Jul. 18, 2017

(54) METHOD FOR AUTOMATIC CORRECTION OF ASTIGMATISM

(71) Applicant: Intelligent Virus Imaging Inc., Southern Pines, NC (US)

(72) Inventors: Ida-Maria Sintorn, Sollentuna (SE); Rickard Nordstrom Nordstrom, Tullinge (SE); Gustaf Kylberg, Sollentuna (SE)

(73) Assignee: Intelligent Virus Imaging Inc., Southern Pines, NC (US)

( * ) Notice: Subject to any disclaimer, the term of this patent is extended or adjusted under 35 U.S.C. 154(b) by 0 days.

(21) Appl. No.: 15/124,099

(22) PCT Filed: Jun. 17, 2015

(86) PCT No.: PCT/US2015/036117
§ 371 (c)(1),
(2) Date: Sep. 7, 2016

(87) PCT Pub. No.: WO2016/014177
PCT Pub. Date: Jan. 28, 2016

(65) Prior Publication Data
US 2017/0018396 A1 Jan. 19, 2017

Related U.S. Application Data

(60) Provisional application No. 62/027,505, filed on Jul. 22, 2014.

(51) Int. Cl.
*H01J 37/26* (2006.01)
*H01J 3/12* (2006.01)
(Continued)

(52) U.S. Cl.
CPC ..... *H01J 37/153* (2013.01); *H01J 2237/1532* (2013.01); *H01J 2237/223* (2013.01)

(58) Field of Classification Search
CPC ............. H01J 37/153; H01J 2237/223; H01J 2237/1532; H01J 3/12; H01J 3/02;
(Continued)

(56) References Cited

U.S. PATENT DOCUMENTS 4,180,738 A 12/1979 Smith et al.
6,552,340 B1 4/2003 Krivanek et al.
(Continued)

*Primary Examiner* — Nicole Ippolito
(74) *Attorney, Agent, or Firm* — Fasth Law Offices; Rolf Fasth

(57) ABSTRACT

The method is for automatic astigmatism correction of a lens system. A first image is provided that is not in focus at a first stigmator setting of a set of lenses. A calculating device calculates a corresponding first Fourier spectrum image. A distribution and direction of pixels of the Fourier spectrum image are determined by calculating a first vector and a second vector. The first vector is compared with the second vector. The lens system is changed from a first stigmator setting to a second stigmator setting to provide a second image. A corresponding Fourier spectrum image is calculated. The distribution and direction of pixels of the second Fourier spectrum image is determined by calculating a third vector and a fourth vector. The third vector is compared to the fourth vector. The image that has the lowest vector ratio is selected.

8 Claims, 7 Drawing Sheets

(51) Int. Cl.
*H01J 29/56* (2006.01)
*H01J 37/153* (2006.01)

(58) Field of Classification Search
CPC ...... H01J 3/04; H01J 3/18; H01J 29/56; H01J 29/62; H01J 37/10; H01J 37/141; H01J 2237/0492; H01J 2237/10
USPC ............... 250/396 R, 397, 398, 396 ML
See application file for complete search history.

(56) References Cited

U.S. PATENT DOCUMENTS

| | | | |
|---|---|---|---|
| 6,570,156 B1* | 5/2003 | Tsuneta | H01J 37/26 250/311 |
| 2002/0056808 A1* | 5/2002 | Tsuneta | H01J 37/21 250/306 |
| 2004/0174588 A1 | 9/2004 | Iwaki et al. | |
| 2006/0060781 A1* | 3/2006 | Watanabe | B82Y 10/00 250/310 |
| 2007/0081158 A1 | 4/2007 | Brady et al. | |
| 2007/0109524 A1* | 5/2007 | Kawakubo | G03F 7/705 355/77 |
| 2007/0120055 A1* | 5/2007 | Sawada | G01N 23/04 250/307 |
| 2013/0062520 A1 | 3/2013 | Henstra et al. | |

\* cited by examiner

METHOD FOR AUTOMATIC CORRECTION OF ASTIGMATISM

PRIOR APPLICATION

This application is a U.S. national phase application based on International Application No. PCT/US2015/036117, filed 17 Jun. 2015, claiming priority from U.S. Provisional Patent Application No. 62/027,505, filed 22 Jul. 2014.

TECHNICAL FIELD

The present invention relates to a method for automatic correction of astigmatism such as astigmatism in lenses of electron-microscopes. More particularly, the present invention includes an automatic image-based objective lens astigmatism correction for electron microscopes.

BACKGROUND AND SUMMARY OF THE INVENTION

High quality image acquisition in electron microscopes requires careful alignment of the electron beam and precise focusing for optimized image contrast and fine detail. In the past, physical features and characteristics of the electron-microscope have been important and used to perform the alignment. The electron beam is aligned by using electro-magnetic devices. A misaligned electron beam results in artifacts (ripples), blurriness in the image, and loss of information on fine details.

An important feature of the present invention is that the method automatically corrects for lens astigmatism during the alignment process by using only image data and without relying on complicated and cumbersome features of the microscope itself. The method of the present invention provides a solution to the above-outlined problems. More particularly, the method is for automatic astigmatism correction in one direction through a set of lenses. Of course, the present invention is not limited to correcting in only one direction because the correction can also be done in many directions simultaneously such as both the x- and y-directions. A first image is provided at a first stigmator setting of a lens. Preferably, the image is under-focused. Based on the first image, a calculating device calculates a first Fourier spectrum image. The distribution and direction of pixels of the Fourier spectrum image are determined by calculating a first vector corresponding to the main direction and extent of the bright pixels, and a second vector being perpendicular to the first vector and corresponding to the extent in that direction. The first vector is compared with the second vector. The set of lenses is changed from a first stigmator setting to a second stigmator setting to provide a second under-focused image. Based on the second image, the second corresponding Fourier spectrum image is calculated. The distribution and direction of pixels of the second Fourier spectrum image is determined by calculating a third vector and a fourth vector. The third vector is compared with the fourth vector. When the first vector is more similar to the second vector than the third vector is to the fourth vector the first image is selected as being more round than the second image. When the third vector is more similar to the fourth vector than the first vector is to the second vector then the second image is selected as being more round than the first image. The stigmator settings providing the Fourier spectrum with the most round Fourier spectrum is what is strived and searched for.

The method further includes the step of calculating grey-weighted moments of a circular Fourier spectrum image as a means of measuring the direction and extent of the intensity distribution.

In another embodiment, a first ratio of eigen-vectors of the first Fourier spectrum image is compared with a second ratio of eigen-vectors of the second Fourier spectrum image.

The image with the lowest ratio is selected.

The x-stigmator and y-stigmator settings are changed to the stigmator settings that correspond to the image with the lowest ratio.

The x-stigmator and the y-stigmator settings can also be simultaneously changed.

In yet another embodiment, the stigmator setting that minimizes the elongation value of the Fourier spectrum image is searched for.

The first and the second images are set to an under-focus or an over-focus.

DETAILED DESCRIPTION

Figure 1:
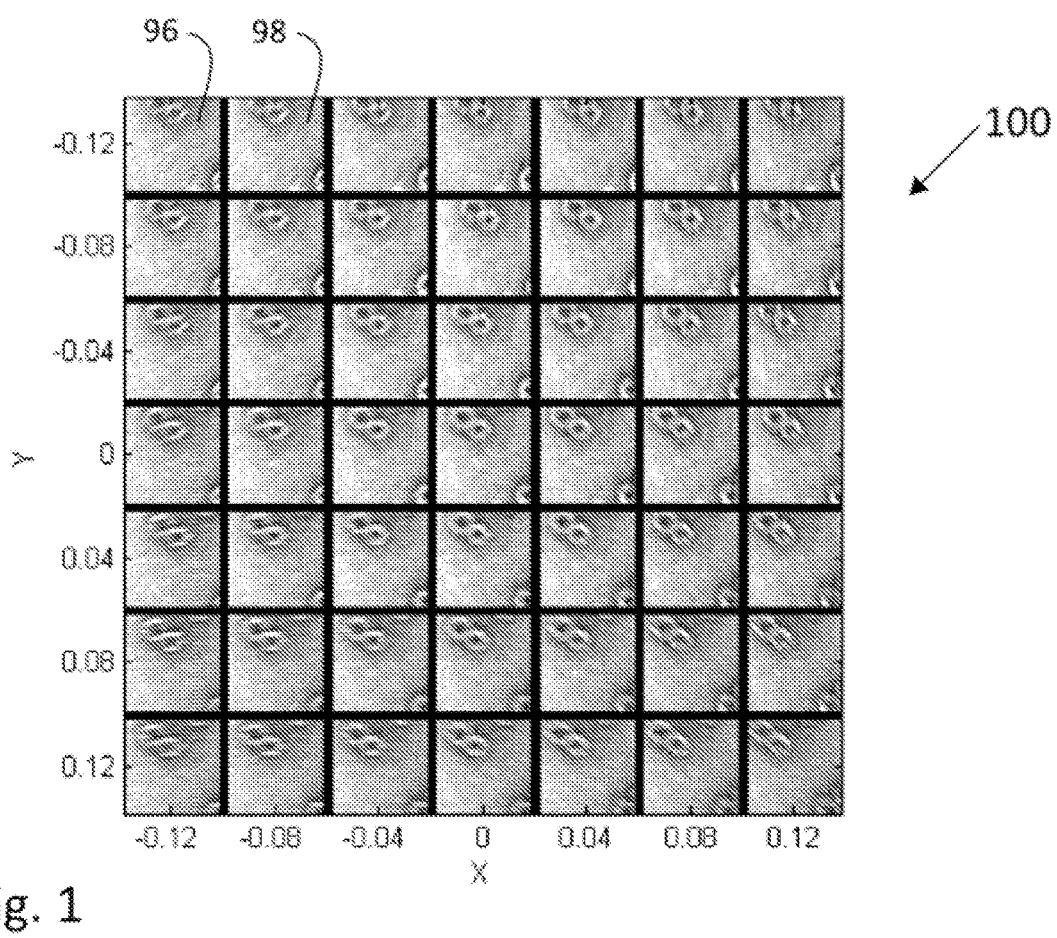
FIG. 1 is a schematic view of examples of images acquired with different objective lens x- and y-stigmator settings.
Figure 2:
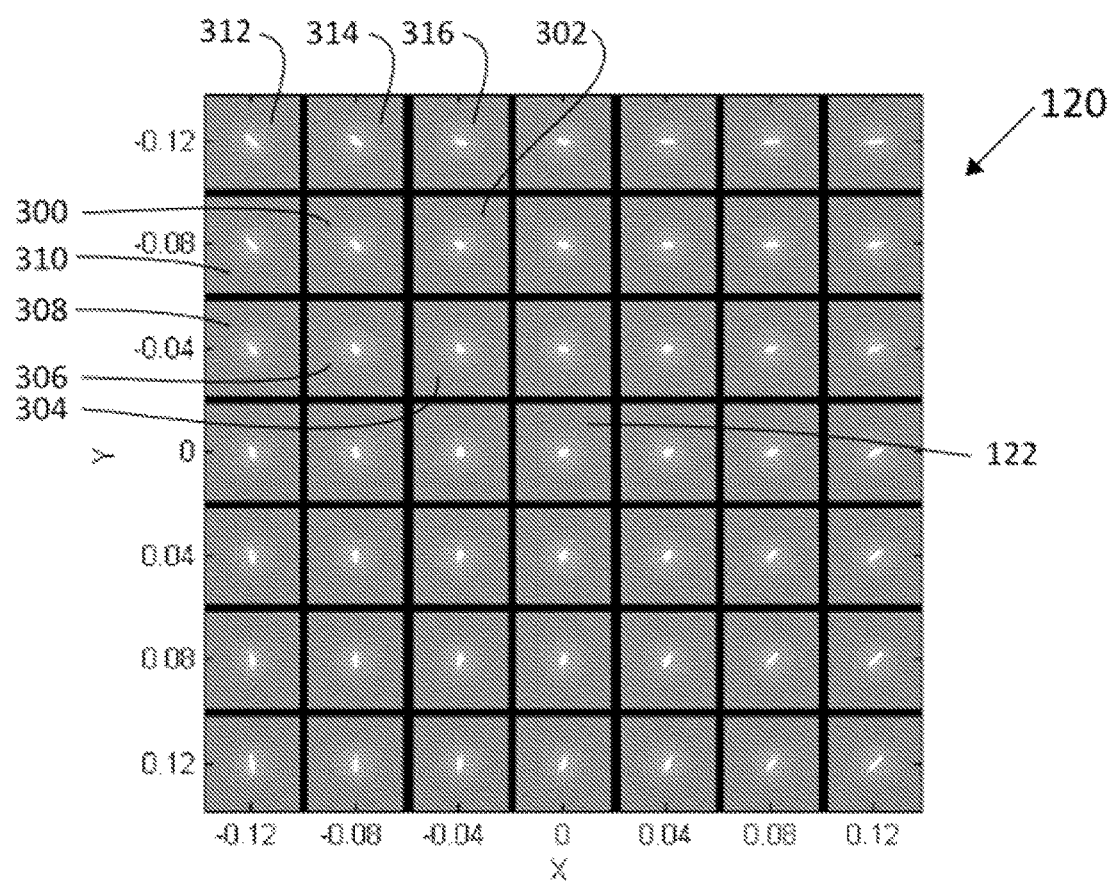
FIG. 2 is a schematic view of the corresponding Fourier spectra of the images of FIG. 1.

FIGS. 1-2 are schematic illustrations 100 of astigmatic images of objects with roughly circular shapes (see FIG. 1) and corresponding Fourier spectra images 120 (see FIG. 2). It does not matter what the image shows but the depicted objects in FIG. 1 are virus-like particles. Astigmatism in the lens-system causes ripple like artifacts and loss of detail in images, corresponding to the Fourier spectrum images to become elongated in a direction that correlates to the direction of the misalignment. FIG. 1 shows examples of images with astigmatism in different directions. More particularly, FIG. 1 shows sample images acquired at different x- and y-stigmator settings. It shows 49 versions of the same view in a transmission electron microscope with different x- and y-stigmator settings. Because the settings are different, the images are blurry in different ways and have waviness in different directions. One object of the present invention is to determine which version is the best image (corresponding to the Fourier spectrum image with the roundest distribution of the pixels). This is difficult to do by merely using manual and visual methods which are most often used today. A feature of the present invention is that the method automatically determines which image is roundest by only using image data. This is then used to automatically adjust the lenses in the microscope so the image becomes stigmatic.

FIG. 2 shows the corresponding Fourier spectra images 120. The transformed images are elongated in directions that correlate to the direction of the misalignment of the lenses originating from the stigmator settings. In general, the Fourier transformation makes it easier to see the astigmatism effects, such as roundness and elongation, of the images. The 49 versions in FIG. 1 are in FIG. 2 shown as 49 new versions (as white elongated shapes/figures) after the Fourier transformation. The image 122 at the center has very little astigmatism (shown as a round image in the Fourier spectrum). The image at the center has an x-stigmator setting of 0 and a y-stigmator setting of 0. It is to be understood that even if it would correspond to other x- and y-stigmator values, it would be the solution because the Fourier spectrum has the most circular pixel distribution at these settings. The further away from the center of FIG. 2, the more ripples and blur exist in the images and the more elongated the pixel distributions appear in the Fourier spectrum images. The computer thus changes the stigmator settings in a step-by-step fashion and determines whether the image is more round or not before the stigmator setting is changed. As described in detail below, when the image is determined to get rounder as a result of an adjustment of the stigmator setting in the x- or y-direction then the computer preferably changes the microscope's stigmator setting again in same direction. When the images do not get rounder, the computer may stop the search or possibly change the stigmator setting in the opposite direction and then compare the roundness.

Figure 3:
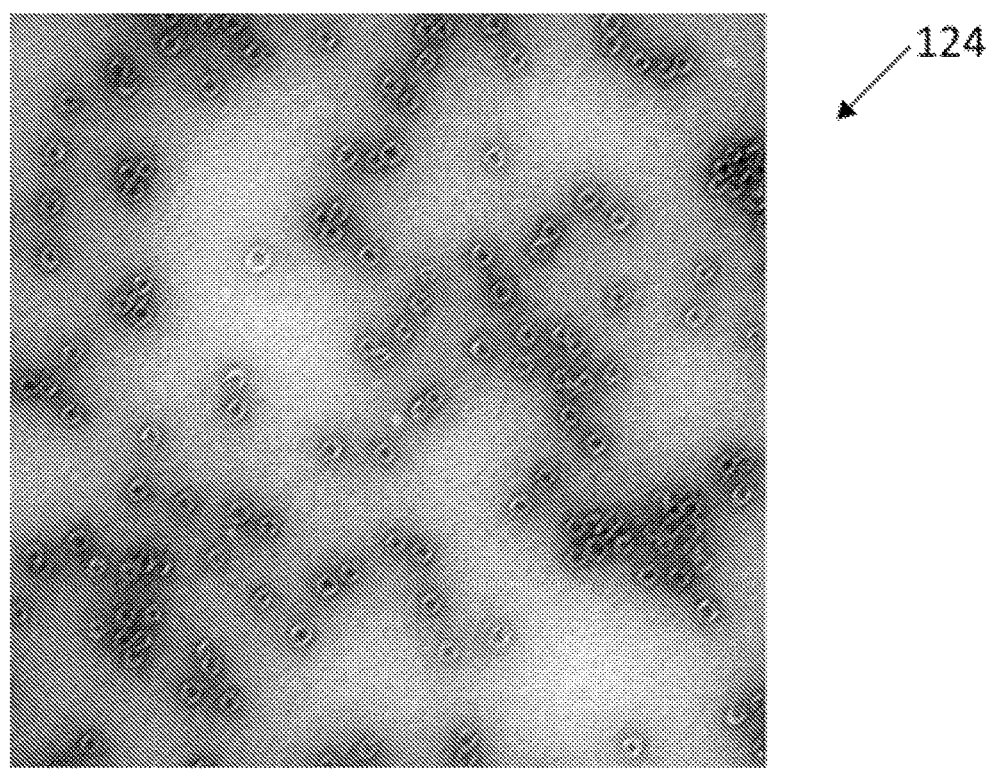
FIG. 3 is a schematic view of an image seen with some micrometers under-focus through a lens with astigmatism.

FIG. 3 shows an image 124 that is seen with some under-focus through a lens-system with astigmatism. As explained below, the use of under-focus is an important feature of the method of the present invention to avoid creating Fourier images with complex shapes. It is also possible to use an over-focus of the lens. Another important feature of the present invention is that the astigmatism is corrected by searching for a minimal elongation (or optimal circuitry) of the shapes in the Fourier spectra. One important goal is thus to select x- and y-stigmator settings that create the most circular distribution of the pixels in the Fourier spectrum i.e. where there is no or very little astigmatism.

The astigmatism correction may be done in at least two different ways. One way is to minimize the elongation in one astigmatism direction at a time, corresponding to one set of electro-magnetic lenses i.e. in one direction such as by only changing the x-stigmator setting before changes of the y-stigmator setting is investigated. Another way is to calculate the direction of the elongation that corresponds to the ratio of x- and y-astigmatism, and, at the same time, optimize both the x- and y-stigmator settings. The elongation of the images in the Fourier spectra of FIG. 2 is measured by using gray-weighted moments. This can also be used in the one-dimensional situation i.e. adjusting the setting in only one direction. The gray-weighted moments are a way to calculate the direction of the bright pixels in the image i.e. the bright intensity distribution.

Figure 4:
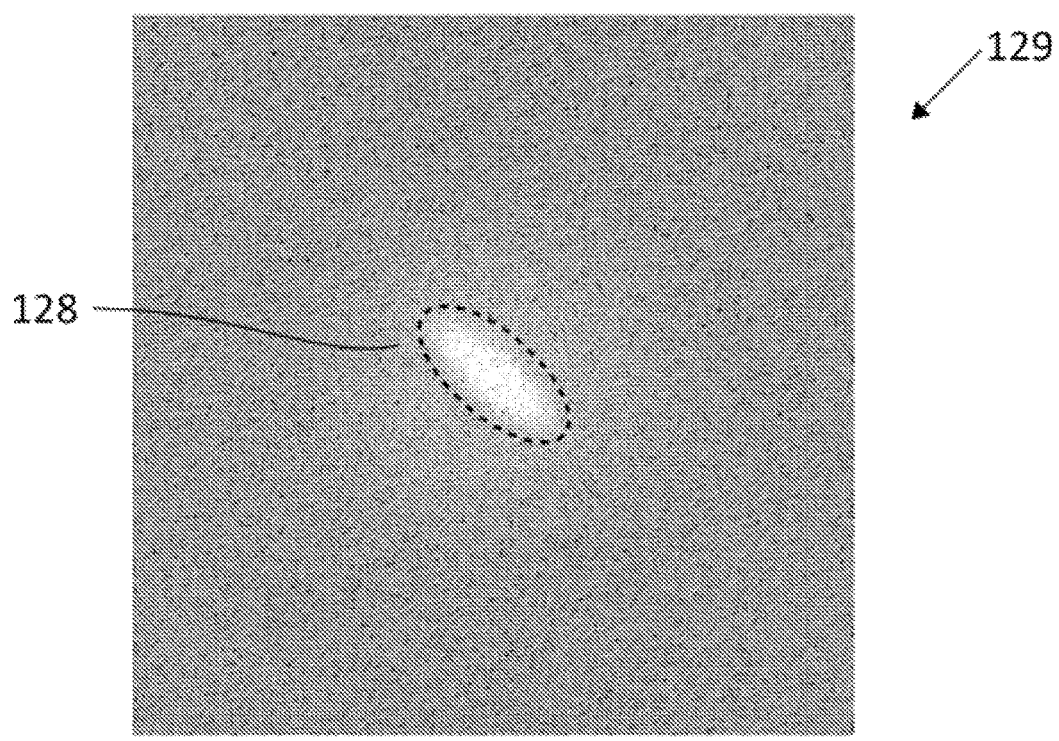
FIG. 4 is a schematic view of a log Fourier spectrum of the image in FIG. 3.

Below is a step-by-step description of the first approach. The x-astigmatism may be corrected by:

1) Acquire an image and calculate the corresponding Fourier spectrum. FIG. 3 is an example of a suitable image 124 that happens to depict virus-like particles at an under-focus of the lens setting. FIG. 4 is an image 126 that shows the corresponding Fourier spectrum. The lighter or light-grey elliptical portion 128 that extends through the center of the image from the upper left to the lower right indicates the astigmatism of the lens system. The portion 128 has been marked with a dashed line to make it easier to see the elliptical portion. The center has also been marked. The size and length of the elliptical portion partly depends on the magnification and content in the image. In general, when the light-grey portion is round or rounder then the settings of the lens system are correct to minimize the astigmatism.

Figure 5:
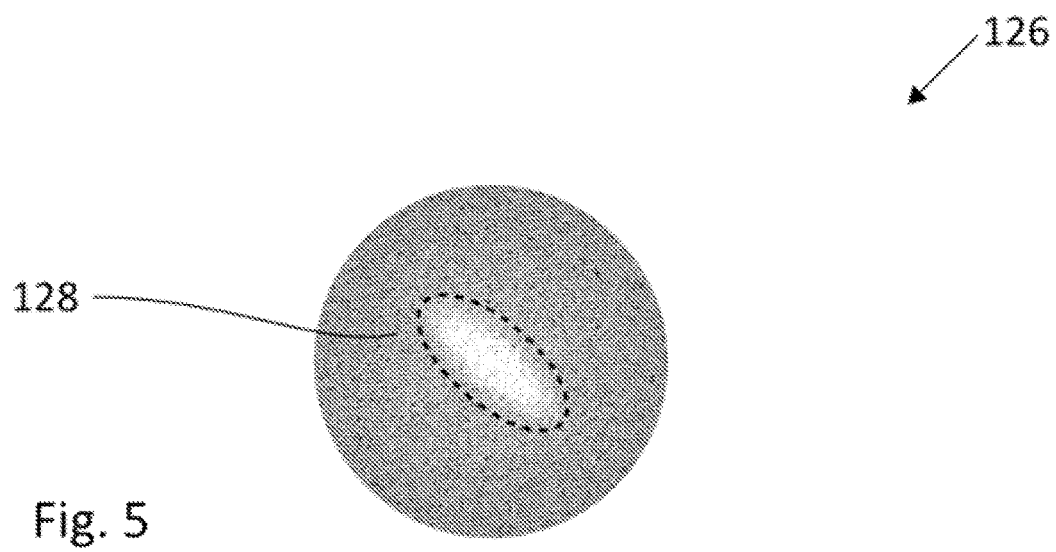
FIG. 5 is a cut-out circular image of the view of FIG. 4.

2) Cut out a circular image 129 that, for example, has diameter that is half the image side. It is not necessary to use a circular image as long as the grey-weighted moments are calculated of the portion of the image that is of interest. It is however preferred/recommended in order to have the same number of pixels contributing to the distribution in all directions. The size of the cut-out should match the magnification provided by the lens. FIG. 5 illustrates the cut-out image 129 of the image 126 shown in FIG. 4. A circular image is preferred so that the radius is the same from the center of the image to the periphery and so that there is the same amount of distance and information in all directions from the center. The lower frequencies in and very close to the center of the Fourier spectrum, and the high frequencies very far from the center, carry information less important as far as indicating astigmatism of the system of lenses.

3) Calculate the distribution of the intensities of the Fourier spectrum image by, for example, using gray-weighted moments (such as orders 1 and 2) of the circular image. It is also possible to use an approach that relies on first making the Fourier spectrum image binary (extracting the elliptical/circular bright shape) and then e.g., do principal component analysis to calculate and determine the distribution and principal directions of the binary shape. It is also possible to use methods that rely on radial density profiles. Preferably, a mathematical method is used to calculate the distribution and direction of the intensity in the image.

A suitable formula for calculating gray-weighted moments is:

$$m_{ij} = \Sigma_x \Sigma_y x^i y^j I(x,y),$$

where x and y are the pixel positions (coordinates) in the image, and I(x,y) is the intensity (gray-value) at image position x,y. The order of the moment is i+j, so there are two moments of order 1, $m_{01}$ and $m_{10}$, and 3 moments of order 2, $m_{20}$, $m_{02}$, and $m_{11}$.

The higher the intensity the lighter the image becomes. The lighter the image pixel is and the further away from the center, the more weight it is given when it comes to calculating the gray-weighted moments used to determining astigmatism. In other words, the weight of each pixel is based on the whiteness of each pixel and its distance to the center wherein bright pixels further away from the center are given more weight. Note though that pixels very far from the center (well outside the bright elongated shape in the Fourier spectrum image), do not contain information related to astigmatism.

Figure 6:
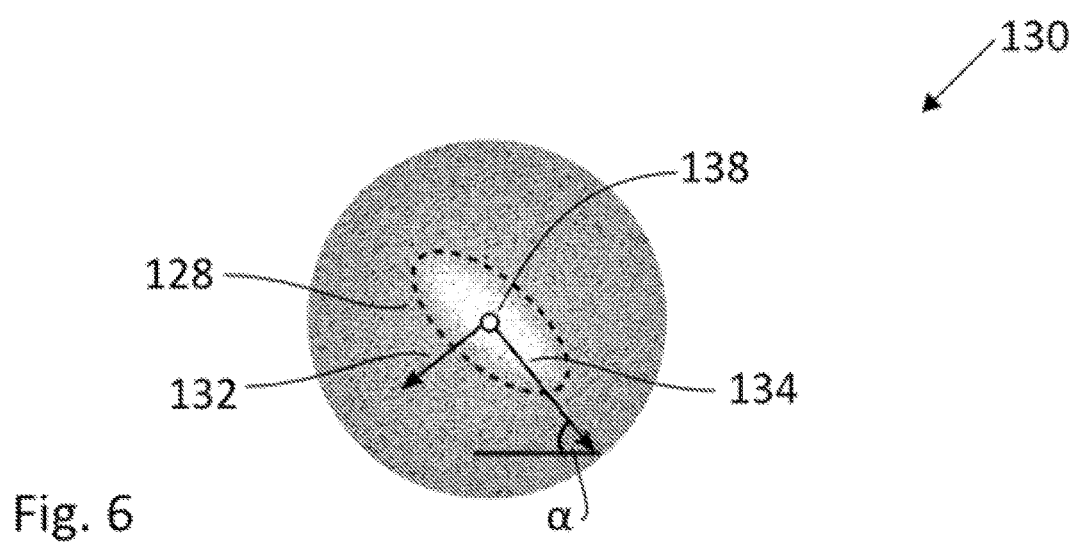
FIG. 6 is the view of FIG. 5 including eigen-vectors of the gray-weighted moments of the gray-values inside the circle wherein the length of the vectors corresponds to the sizes of the eigen-vectors.

FIG. 6 is a view 130 that is the same as view 129 of FIG. 5 but it includes eigen-vectors 132, 134 of the gray-weighted moments of the gray-values inside the circle wherein the length of the vectors correspond to the sizes of the eigen-vectors. The gray-weighted moments may be used to calculate the intensity distribution around the center point 138. In other words, the gray-weighted moments are preferably used to describe the directions and how stretched out the light-colored portion 128 extends in the directions relative to the center 138. It is then possible to determine how elliptical the light-color portion 128 is and how non-round it is. The non-roundness of the image indicates the level of astigmatism of the lens and the direction of the image contains information about how to correct for the astigmatism. The moments are thus used to derive the main direction of intensities in the image as well as how much more distributed the intensities are along the main direction in relation to the orthogonal direction. The ratio of the distribution in the second direction and the distribution in the main direction is a measure of how elongated the distribution is. It is to be understood that the ratio is merely an illustrative example and that other comparison parameters such as differences between the vectors may be used as long as the goal is to determine a change of the stigmator settings that leads to a rounder figure in the Fourier spectrum image.

4) Determine the elongation that corresponds to the ratio of eigenvector 132 and 134 of the normalized moment co-variance matrix=[m20/m00, m11/m00; m11/moo, m02/m00]. Eigenvector 134 shows the longest elongation (i.e. how the long the distribution of whitish pixels is) and extends along the direction of the light colored elliptical shape. Eigen vector 132 shows the second longest elongation that is perpendicular to eigenvector 134 in the two-dimensional image. The direction and length of eigenvector 134 is the most interesting. When the eigenvector 134 has a length that is identical or close to eigenvector 132 then the stigmator setting have been correctly set to compensate for the astigmatism of the lens system i.e. the ratio between the eigenvectors is 1 or close to 1. The further away from 1 the ratio is the more astigmatism of the lens.

5) Repeat steps 1-4 above in an iterative optimization algorithm that searches for the stigmator settings that minimizes the elongation value. The adjustments are thus made to make the ratio as close to one as practically possible.

The same correction for y-astigmatism may be done as for the correction for x-astigmatism described above by keeping the x-stigmator at the hitherto determined best setting and repeat the procedure for the y-stigmator as was done for the x-stigmator described above. In other words, the correction for y-astigmatism may be done by keeping the x-stigmator at the best setting, as determined above, and repeat steps 1-5 above only for the y-stigmator. Instead of manually determining which image is the roundest among all the images along one row in the x-direction of FIG. 1, the method of the present invention thus does this determination automatically by analyzing the Fourier spectrum for each image and determines the amount of elongation and selects the image with the smallest elongation, whereafter the stigmators of the microscope are set to the corresponding values. In other words, once the roundest image has been found along one row in the x-direction, as shown in FIG. 2, and the corresponding x-stigmator value set in the microscope, then the method may determine the roundest image in the y-direction along the column of the roundest image found in the row in the x-direction.

In order to speed up the correction procedure and to make it more robust, the Fourier spectra can be down-sampled and filtered with a smoothing filter (e.g. mean, median or Gauss) prior to calculating the moments.

Figure 7:
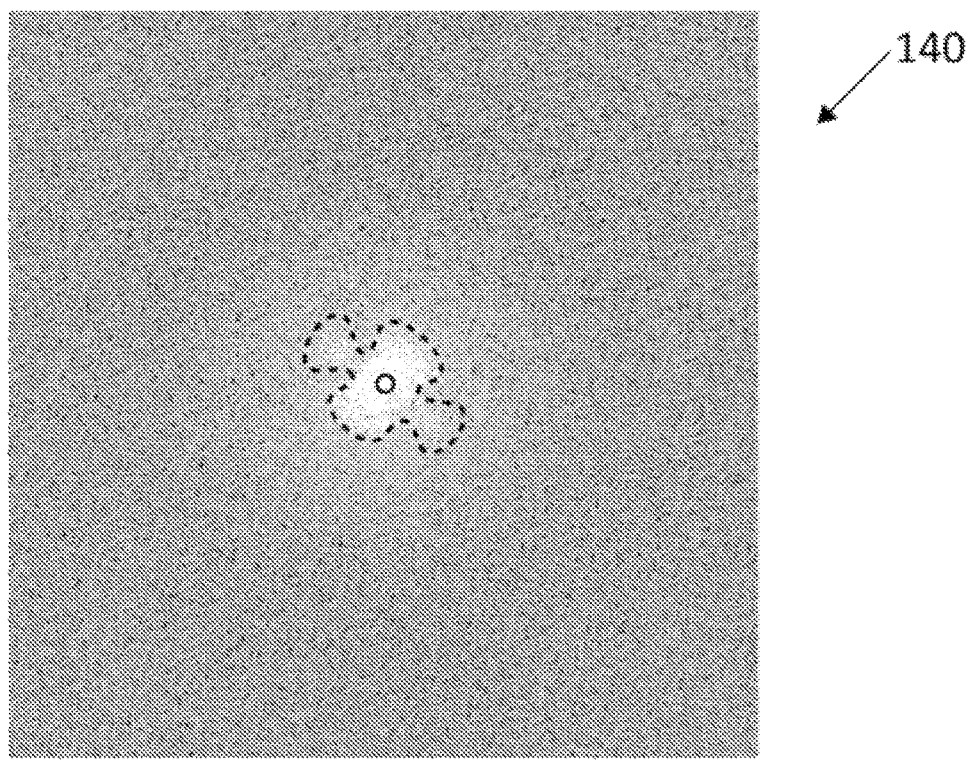
FIG. 7 is the same view as FIG. 4 but with no or very little under-focus.

One important feature of the present invention is that the correction is preferably done at a relatively large under-focus (or over-focus). When the image is very close to or in focus, the astigmatism effect in the Fourier spectrum is not so easy to single out and measure and it is difficult to use those spectra to correct for the astigmatism. Different directions are then in focus at slightly different under (or over) focus due to the astigmatism. This, together with information from sharp image details, generates strong disturbing signals in the Fourier spectrum with respect to determining the direction and amount of astigmatism in the lens system. In other words, by setting the sample so that it is not in or close to focus the fault of the astigmatism is not interfered so much by other factors. FIG. 7 shows an image 140 that has as much astigmatism as the example in FIG. 6 but the corresponding image is in focus. By placing the sample at an under-focus the problem of astigmatism is first solved without any disturbance of any problem associated with having the correct focus of the lens. By using an under-focus, it is easier to determine whether the roundness of the Fourier spectrum improves or not when the stigmator settings of the lens system are changed. Image 140 clearly shows how difficult it is to see the direction and extent of the astigmatism because there is no pronounced elongation. In addition, the Fourier spectra also depend upon the image content. In a very unlikely event, the content may produce intensity in the Fourier spectrum that makes the method unsuccessful the first time. This can be solved by repeating the optimization procedure in another place of the sample image to make sure the same answer is obtained.

Figure 8:
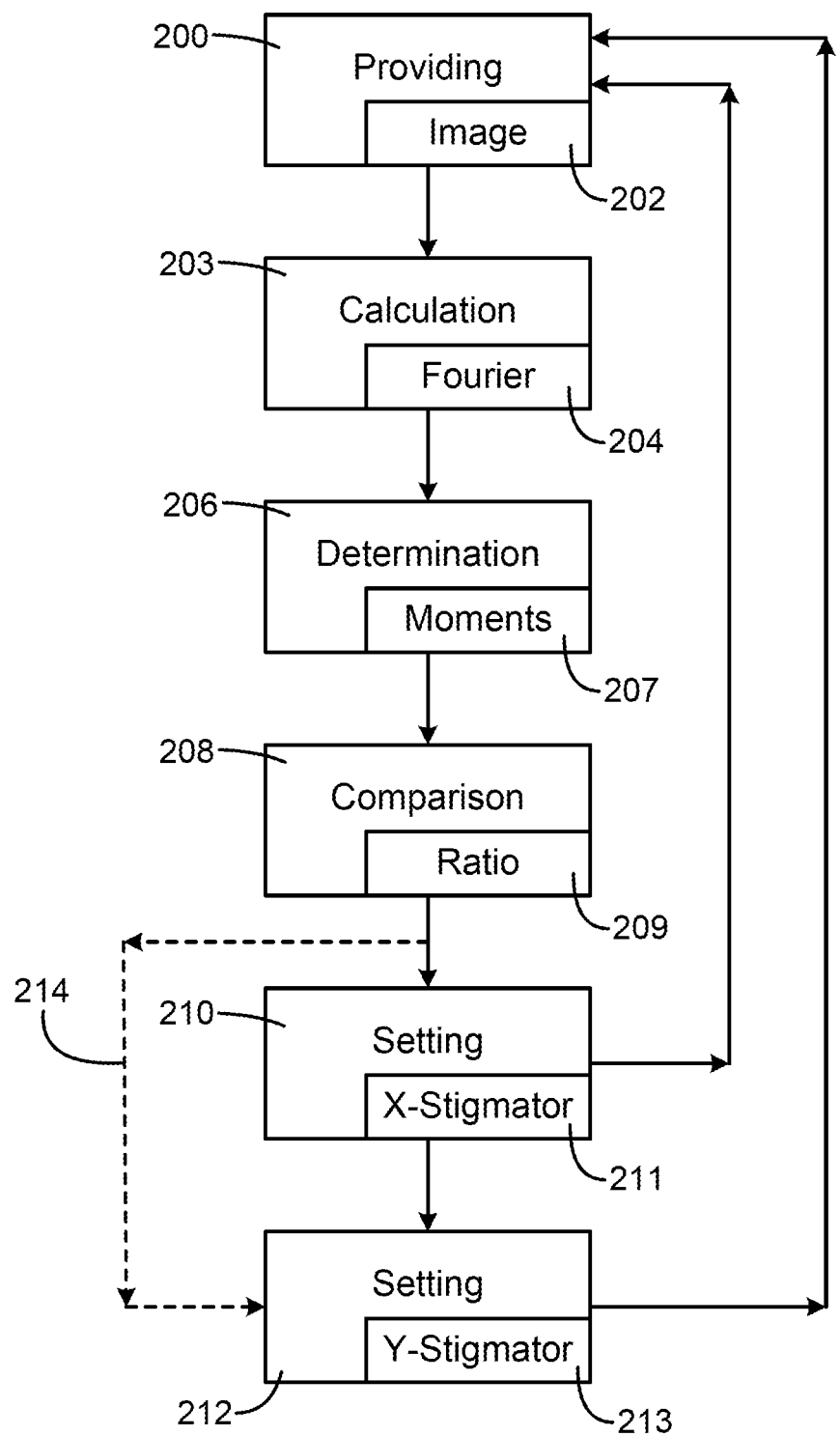
FIG. 8 is a schematic view of an information flow of the method steps of the present invention.

In operation, certain steps of the method of the present invention are outlined in FIG. 8. In a providing step 200, an under-focused image 202 (such as the first image 96 in FIG. 1) is provided at a first value of an x-stigmator setting and at a first value of a y-stigmator setting. In a calculation step 203, a corresponding Fourier spectrum image 204 (such as image 312 in FIG. 2) is calculated by a calculating device such as a computer. In a determination step 206, gray-weighted moments 207 of the image 204 are calculated by the computer to determine the distribution and direction of the pixels in the image. In a comparison step 208, a ratio 209 or difference between eigen-vectors are compared by the computer to determine the roundness of the image 204. In a setting step 210, the computer changes the setting in the microscope of the x-stigmator (or the y-stigmator) 211 from the first value to a second value wherein the second value preferably is a sequential increase or decrease compared to the first value such as going from e.g., −0.12 to −0.08, as shown in FIG. 1 so that a new image at the second value of the x-stigmator is displayed. The corresponding Fourier spectrum image is then calculated. The computer may be programmed so that it continues to change the x-stigmator in the same direction as long as the vector ratios improve and if the ratios increase then the x-stigmator setting is changed in the opposite direction instead. It is also possible to use relatively large changes of the stigmator setting in the beginning and then reduce the changes of the x-stigmator setting as the ratios improve i.e. get closer to 1 or it is determined that the likely best setting of the x-stigmator has been passed. For example, if the ratio is gradually reduced and then starts to increase the size of change of the stigmator setting is reduced and the direction is changed. Preferably, the y-stigmator is kept at the first value such as −0.12 which corresponds to the first row in FIGS. 1-2. FIGS. 1-2 show preferred examples values for the x-stigmator and for the y-stigmator. The stigmator values may differ from system to system. Other values and intervals may also be used. The computer starts the same iteration and does the calculation step 203 and determination step 206 with the x-stigmator set to the second value. In the comparison step 208, a second eigen-vector ratio at the second value is compared to the first eigen-vector ratio at the first value of the x-stigmator setting. If the first ratio is closer to one than the second ratio, then the computer stops the search in the x-direction. If the second ratio is closer to one than the first ratio then the computer, in the setting step 210, changes the value setting of the x-stigmator from the second value to a third value such as −0.04. This iteration continues with fourth, fifth etc. values until the computer determines that the next x-value does not result in a rounder image i.e. when the new eigen-vector ratio is not closer to one compared to the vector ratio associated with the previous x-stigmator value.

When the best x-stigmator value has been found then the computer, in a setting step 212, changes the y-stigmator 213 setting from a first value, such as −0.12 as shown in FIGS. 1-2, to a second value, such as −0.08. The computer does the same iteration as that was done for the x-stigmator setting until the best y-stigmator setting has been found. However, the x-stigmator is fixed at the value as determined in the first iteration so the setting step 210 is skipped as illustrated by the dashed line 214 in FIG. 8.

Instead of merely adjusting the stigmator setting in one direction at a time (such as the x-stigmator) it is also possible to adjust the stigmator settings in both the x- and y-directions at the same time. This is illustrated in FIG. 2 wherein image 300 may be an image selected as a starting image. The system then investigates the eigen-vector ratio of not only image 302 (by adjusting the stigmator setting only in the x-direction) but also investigates the ratios as a result of stigmator settings of the images surrounding image 300 so that the eigen-vector ratios of images 304, 306, 308, 310, 312, 314 and 316 are determined. The system then selects the x- and y-stigmator settings that result in the lowest vector ratio, as explained above, which most likely is closer to the center compared to the starting image 300, as shown in FIG. 2. These steps are iterated, as outlined in FIG. 8, until the lowest ratio is found and the image is determined to show the most round image. This is the preferred x- and y-stigmator settings that should be used to best compensate for the astigmatism of the lens system. As best shown in FIG. 6, the size of the two eigen-vectors 132, 134 together with the angle alpha of the elliptical image 130 may thus be used to indicate which direction is likely going to be the best. As indicated earlier, it is also possible to simply continue in the same direction, without calculating the ratios in all directions, as long as the ratios improve i.e. get closer to 1. When the ratios start to increase again, the computer may then start to investigate all the directions, as described above.

While the present invention has been described in accordance with preferred compositions and embodiments, it is to be understood that certain substitutions and alterations may be made thereto without departing from the spirit and scope of the following claims.

We claim:

1. A method for automatic astigmatism correction of a lens system, comprising,
   providing a first image of a view not being in focus at a first stigmator setting of a lens,
   based on the first image at the first stigmator setting, a calculating device calculating a first Fourier spectrum image,
   determining a distribution and directions of intensities in the image by calculating a first vector and a second vector,
   comparing the first vector with the second vector,
   changing the lens from the first stigmator setting to a second stigmator setting to provide a second image of the view not being in focus, the second image at the second stigmator setting being of the same view as the first image of the view at the first stigmator setting,
   the calculating device, calculating a second Fourier spectrum image based on the second image at the second stigmator setting,
   determining the distribution and directions of intensities in the second Fourier spectra image by calculating a third vector and a fourth vector,
   comparing the third vector with the fourth vector,
   when the first vector is more similar to the second vector than the third vector is to the fourth vector selecting the first image at the first stigmator setting, and
   when the third vector is more similar to the fourth vector than the first vector is to the second vector selecting the second image at the second stigmator setting.

2. The method of claim 1 wherein the method further comprises the step of calculating gray-weighted moments of a circular image.

3. The method of claim 2 wherein the method further comprises the step of comparing a first ratio of eigen-vectors of an intensity distribution of the first Fourier spectrum image with a second ratio of eigen vectors of an intensity distribution of a second Fourier spectrum image.

4. The method of claim 3 wherein the method further comprises the step of selecting an image having a lowest ratio.

5. The method of claim 1 wherein the method further comprises the step of changing x-stigmator and y-stigmator settings.

6. The method of claim 5 wherein the method further comprises the step of simultaneously changing the x-stigmator and the y-stigmator setting.

7. The method of claim 1 wherein the method further comprises searching for a stigmator setting that minimizes an elongation value a selected Fourier spectrum image.

8. The method of claim 1 wherein the method further comprises setting the first and the second images to an under-focus.

* * * * *